(12) United States Patent
Mayer et al.

(10) Patent No.: US 9,365,417 B2
(45) Date of Patent: Jun. 14, 2016

(54) METHOD FOR MANUFACTURING A MICROMECHANICAL COMPONENT

(71) Applicant: Robert Bosch GmbH, Stuttgart (DE)

(72) Inventors: Thomas Mayer, Reutlingen (DE); Heribert Weber, Nuertingen (DE); Jens Frey, Filderstadt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/553,690

(22) Filed: Nov. 25, 2014

(65) Prior Publication Data

US 2015/0151962 A1  Jun. 4, 2015

(30) Foreign Application Priority Data

Nov. 29, 2013  (DE) .......................... 10 2013 224 623

(51) Int. Cl.
*H01L 29/84* (2006.01)
*B81C 1/00* (2006.01)

(52) U.S. Cl.
CPC ..... *B81C 1/00269* (2013.01); *B81C 2203/0109* (2013.01)

(58) Field of Classification Search
CPC ............ B81C 1/00515; B81C 1/00269; B81C 2203/0109
See application file for complete search history.

(56) References Cited

U.S. PATENT DOCUMENTS

| 2002/0045359 | A1* | 4/2002 | Todd ............................. 438/780 |
| 2009/0235915 | A1* | 9/2009 | Doumanidis et al. ..... 126/263.01 |
| 2013/0203199 | A1* | 8/2013 | Huang et al. .................... 438/51 |
| 2013/0277771 | A1* | 10/2013 | Chou et al. ..................... 257/415 |
| 2013/0277774 | A1* | 10/2013 | Frey et al. ...................... 257/415 |

* cited by examiner

*Primary Examiner* — Jerome Jackson, Jr.
*Assistant Examiner* — Wasiul Haider
(74) *Attorney, Agent, or Firm* — Norton Rose Fulbright US LLP

(57) ABSTRACT

A method for manufacturing a micromechanical component includes the following sequential steps: a first material layer including a first joining partner being applied to a first wafer; a second material layer including a second joining partner being applied to a second wafer; a micromechanical structure being created in the first wafer by gas phase etching with the aid of a gaseous etching medium which is applied to the first joining partner; the first and second wafers being joined in such a way that they are in contact at least in some areas; and the first and second joining partners being heated to be integrally joined to form a connecting layer, a eutectic joining material being formed in the connecting layer from the first joining partner and the second joining partner.

9 Claims, 4 Drawing Sheets

METHOD FOR MANUFACTURING A MICROMECHANICAL COMPONENT

BACKGROUND OF THE INVENTION

1. Field of the Invention

The present invention is directed to a method for manufacturing a micromechanical component.

2. Description of the Related Art

Such methods are generally known. The disadvantage of the known methods is that the manufacture of a eutectic joint between two wafers requires clean and oxide-free surfaces of the joining partners. In particular in the case of wet-chemical cleaning with a subsequent rinsing step in water and/or in the case of contact of the joining partners with air, chemically and mechanically stable oxides are created on the surface of the joining partners, which are undesirable, impair the joining or bonding process, and must be removed.

BRIEF SUMMARY OF THE INVENTION

It is an object of the present invention to provide a method for manufacturing a micromechanical component, which allows simplified manufacture compared to the related art, the joining process being shortened and/or the number of process steps being reduced.

The method according to the present invention for manufacturing a micromechanical component and the micromechanical component according to the present invention have the advantage over the related art that a micromechanical component is manufactured by joining at least two wafers using low complexity. It is particularly preferred if, during the creation of freely movable micromechanical structures, the gas phase etching process for removing the sacrificial layer beneath the micromechanical structures is simultaneously also used to apply the gaseous etching medium to the first joining partner, so that a protective layer is created on its surface, which prevents oxidation of the surface.

The micromechanical component is preferably a sensor including a microelectromechanical system (MEMS), such a sensor here also being referred to as a MEMS sensor. The MEMS sensor is in particular an inertial sensor, for example a rotation rate sensor and/or an acceleration sensor, a micromirror (MEMS mirror), or an infrared sensor.

The wafer is preferably a thin disk made of semiconductor material, to which in particular MEMS structures and/or integrated circuits are applied or have been applied. For example, the semiconductor material is a substrate made of silicon.

The layer system referred to as the first material layer preferably also includes a first substrate of the first wafer and/or a first functional layer, in addition to the first joining partner. In particular, the first functional layer includes a polysilicon material (epi-polysilicon material) deposited on the substrate. The first joining partner is preferably applied to the first substrate or the first functional layer by sputtering (cathodic evaporation) or chemical vapor deposition (CVD) or low-pressure chemical vapor deposition (LPCVD). Preferably the same applies analogously to the second material layer including the second joining partner, the second material in particular then including a second substrate and/or a second functional layer.

The freely movable micromechanical substructure is preferably created by trenching and gas phase etching, the movable substructure being generated from the first substructure by trenching (i.e., trench formation) and removing the sacrificial layer situated beneath. The sacrificial layer preferably includes silicon oxide. The sacrificial layer is preferably removed by etching with the aid of a gaseous etching medium (gas phase etching). The gaseous etching medium used for this purpose is an etching gas having a hydrogen fluoride (HF) component, for example.

When assembling the first and second wafers, the wafers are preferably oriented and positioned in such a way that the first joining partner and the second joining partner are in contact at least in some areas, and in particular form one or multiple bonded areas in which the first and second joining partner are joined. This may be understood to mean in particular also that the joining partners contact each other along their entire surface. The bonded areas may in particular be continuous bonded areas along a plane which is essentially parallel to a main extension plane of the first and/or second wafer(s) or bonded areas which are separated from each other along the plane.

The first and second joining partners are preferably heated in such a way that the first and second joining partners are integrally joined to form a connecting layer, so that a eutectic joining material is formed from the first joining partner and the second joining partner. This means, for example, that the first and/or second joining partner(s) is/are heated to a joining temperature, the joining temperature in the case of a eutectic joining material composed of an aluminum-germanium alloy being in particular between 324° C. (degrees Celsius) and 524° C., preferably between 354° C. and 494° C., particularly preferably between 394° C. and 454° C., exceptionally preferably 455° C.

According to one preferred refinement, it is provided that, in the third manufacturing step, the micromechanical structure is exposed by gas phase etching with the aid of the gaseous etching medium, a sacrificial layer in the first material layer being removed, in particular a gas having a hydrogen fluoride component being used as the etching medium.

In this way it is advantageously possible to use the gaseous etching medium both for completing the micromechanical structure and for treating the first joining partner, so that the joining (bonding) of the joining partners may be carried out more time-efficiently and more cost-effectively. The advantage of hydrogen fluoride (HF) gas phase etching over wet-chemical hydrofluoric acid etching (HF etching)—i.e., using an aqueous solution of hydrogen fluoride—is that an interaction between a surface of the first joining partner and water and air is not possible and the formation of an oxide layer may be prevented. In particular, it is furthermore possible with the aid of gas phase etching to prevent movable structures from sticking together, which may occur in the drying step after a wet-chemical etching process.

According to one further preferred refinement, it is provided
that an aluminum material is used as the first joining partner and a germanium material is used as the second joining partner; or
that a germanium material is used as the first joining partner and an aluminum material is used as the second joining partner; or
that a metallic alloy is used as the first and second joining partners, the metallic alloy in particular being an aluminum-germanium alloy.

In this way it is advantageously possible for the finished micromechanical component to be temperature-stable over a comparatively large temperature range compared to other alloys which have a lower melting temperature, and to be used at accordingly higher temperatures. In particular, the aluminum material of the first or second joining partner is an aluminum alloy.

According to one further preferred refinement, it is provided that, in the third manufacturing step, a first oxide layer of the first joining partner is removed by a first reduction reaction with the aid of the gaseous etching medium, and that a first protective layer is generated on a surface of the first joining partner, in particular the first oxide layer including an aluminum oxide material and the first protective layer including an aluminum fluoride material. According to one further preferred refinement, it is provided that, in the third manufacturing step, the etching medium is applied to the second joining partner, and a second oxide layer of the second joining partner is removed by a second reduction reaction with the aid of the gaseous etching medium, and a second protective layer is generated on the second joining partner, so that in particular the second oxide layer includes a germanium oxide material and the second protective layer includes a germanium(II)-fluoride material, or is made of a germanium surface covered with fluorine. The second protective layer is preferably generated in that the second protective layer has a fluorine-covered germanium surface. The first reduction reaction in particular includes a reduction of aluminum oxide by reaction with the HF gas phase atmosphere to obtain aluminum fluoride and water.

In this way, it is advantageously possible for a comparatively homogeneous and sufficiently thick first protective layer to be formed during the application of an HF gas to the first and/or second joining partner(s), or during a treatment of the first and/or second joining partner(s) with an HF gas, and for oxidation of the surfaces after HF gas phase etching to be suppressed. In the event that the first joining partner includes the aluminum material, the protective layer includes an aluminum fluoride material. Compared to aluminum oxide, aluminum fluoride is easier to convert during the joining process (bonding) and thus does not form a dense diffusion barrier between the aluminum and germanium, which accelerates the bonding process and thus results in a simplification of the bonding process.

According to one further preferred refinement, it is provided that, in the third manufacturing step, a first layer thickness of the first protective layer and/or a second layer thickness of the second protective layer is/are defined by controlling a gas phase etching temperature of the etching medium.

In this way, it is advantageously possible to control the first and/or second reduction reaction(s) by controlling the gas phase etching temperature during the gas phase etching. The first and/or second layer thickness(es) is/are preferably between 0.1 nanometers (nm) and 100 nm, particularly preferably between 0.5 nm and 50 nm, exceptionally preferably between 1 nm and 20 nm.

According to one further preferred refinement, it is provided that, in the fifth manufacturing step, an intermediate layer is generated within the connecting layer from the first and/or second protective layer(s). This layer may be designed as a closed and/or as a perforated layer.

In this way, it is advantageously possible to generate an intermediate layer which is essentially made of fluorine or a fluorine-containing material. Prior to the joining process, the first and/or second protective layer(s) made of a fluorine or fluoride layer is/are advantageously used to prevent a regeneration of native oxide on the surfaces of the first and/or second joining partner(s). By removing the first and second oxide layers, the generation of a eutectic joint (eutectic bond) is considerably simplified.

According to one further preferred refinement, it is provided that, in the fifth manufacturing step, the first and second joining partners are heated to a joining temperature, a pressing force being acted on the first and second wafers, the joining temperature being changed according to a defined temperature profile and/or the pressing force being changed according to a defined pressing force profile during the integral joining of the first and second joining partners to form the connecting layer.

In this way it is advantageously possible to provide a time- and cost-efficient method and still generate a stable, homogeneous and hermetically sealed connecting layer.

According to one further preferred refinement, it is provided that, in the first manufacturing step, the first joining partner is applied to the first wafer, in particular by cathodic evaporation, and/or that, in the second manufacturing step, the second joining partner is applied to the second wafer by low-pressure chemical vapor deposition. In particular, cathodic evaporation is also referred to here as sputtering.

In this way it is advantageously possible that, in the second manufacturing step, germanium is used as the reaction gas and hydrogen is used as the carrier gas for the low-pressure chemical vapor deposition in such a way that hydrogen atoms of the carrier gas are intercalated into the second joining partner. In the fifth manufacturing step, the joining temperature is preferably controlled in such a way that the intercalated hydrogen atoms diffuse in the second joining partner to the boundary surface between the first and second protective layer and there form hydrogen fluoride with the existing fluorine atoms. This, in turn, causes still present aluminum and germanium oxide compounds to be broken up and favors the joining process between aluminum and germanium.

According to one further preferred refinement, it is provided that the first joining partner and/or the second joining partner is/are applied with the aid of chemical vapor deposition (CVD), physical vapor deposition (PVD), chemical vapor deposition at atmospheric pressure (APCVD) and/or with the aid of plasma-assisted chemical vapor deposition (PECVD).

According to one preferred refinement of the micromechanical component, it is provided that the intermediate layer created during the joining process has an intermediate layer thickness between 1 nanometer (nm) and 100 nm, preferably between 1 nm and 40 nm, particularly preferably between 1 nm and 20 nm.

According to one further preferred refinement of the micromechanical component, it is provided that the micromechanical component has a cavity situated between the first and second material layer, the cavity being hermetically sealed by the connecting layer.

According to one further preferred refinement of the micromechanical component, it is provided that the component is manufactured from a first and a second wafer, the component having a micromechanical structure, the micromechanical structure being situated in a hollow space which is hermetically sealed by the connecting layer, the hollow space in particular including a cavity, the cavity in particular being formed from the second wafer.

According to one further preferred refinement of the micromechanical component, it is provided that the micromechanical structure is formed from the first wafer, the component including a circuit component, the circuit component being formed from the second wafer.

According to one further preferred refinement of the micromechanical component, it is provided that the component includes further microelectromechanical structures formed from the first and/or second wafer, and/or electronic circuit components, in particular integrated circuits.

Exemplary embodiments of the present invention are shown in the drawings and are described in greater detail in the following description.

DETAILED DESCRIPTION OF THE INVENTION

Figure 1:
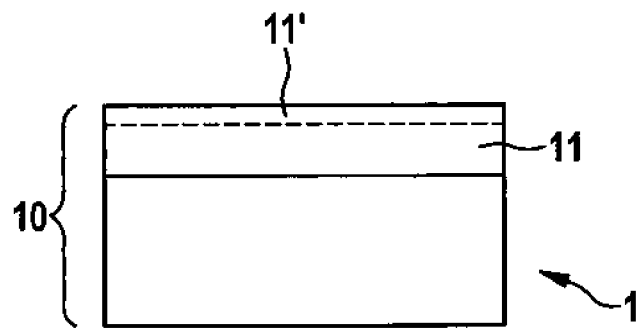
FIGS. 1 through 5 show different method steps according to one exemplary specific embodiment of the method according to the present invention.

Identical parts are always denoted by the same reference numerals in the various figures and are therefore generally also cited or mentioned only once.

FIGS. 1 through 5 show different method steps according to one exemplary specific embodiment of the method according to the present invention for manufacturing a micromechanical component 3.

FIG. 1 shows a detail of a first wafer 1 including a first material layer 10 and a first joining partner 11 in a cross-sectional view, which is formed in a first manufacturing step by a first material layer 10 including a first joining partner 11 being applied to first wafer 1. Moreover, first joining partner 11 includes an oxide layer 11', which is created by oxidation of first joining partner 11 in air (native oxide), for example. First joining partner 11 is preferably applied to first material layer 10 by cathodic evaporation (sputtering) or low-pressure chemical vapor deposition (LPCVD). First joining partner 11 preferably includes an aluminum material—in particular AlCu, AlSiCu, or high-purity Al—as it is used standard in the manufacture of semiconductor chips or semiconductor components, or a eutectic alloy.

Figure 2:
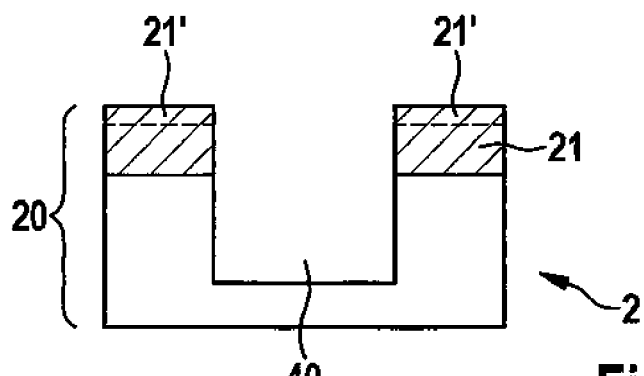

FIG. 2 shows a detail of a second wafer 2 including a second material layer 20 and a second joining partner 21 in a cross-sectional view, which is formed in a second manufacturing step by a second material layer 20 including a second joining partner 21 being applied to second wafer 2. Moreover, second joining partner 21 includes an oxide layer 21', which is created by oxidation of second joining partner 21 in air (native oxide), for example. Second joining partner 21 preferably includes a germanium material or a eutectic alloy. Second joining partner 21 is preferably applied to second material layer 20 by sputtering or low-pressure chemical vapor deposition (LPCVD). Second wafer 2 optionally has one or multiple depressions/caverns or cavities 40, in which second joining partner 21 is situated in the form of a bonded frame peripherally around cavity 40. This makes it possible in the later sealing/bonding process to be able to create a hermetically tightly sealed volume or a hermetically tightly sealed hollow space.

Figure 3:
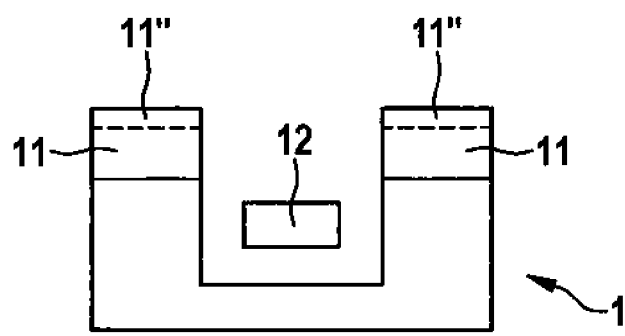

FIG. 3 shows a first wafer 1, in a third manufacturing step, which in particular follows the first and/or second manufacturing step(s), a micromechanical structure 12 being created in first wafer 1 by trenching and gas phase etching with the aid of a gaseous etching medium, the etching medium being applied to first joining partner 11 during the gas phase etching. Micromechanical structure 12 (MEMS structure 12) preferably includes a freely movable substructure, which is generated from a first functional layer made of epi-polysilicon by trenching and removal of the sacrificial layer beneath—in particular made of silicon oxide (sacrificial oxide)—by etching with the aid of gaseous hydrogen fluoride. During the gas phase etching of the sacrificial oxide for creating MEMS structure 12, first joining partner 11—in particular including an aluminum material—of the bonded frame is preferably not covered by a protective layer, but is deliberately exposed to the etching medium. In this way, in the case of a first joining partner 11 including an aluminum material, a protective layer 11" made of aluminum fluoride is formed from the aluminum oxide of first oxide layer 11', using hydrogen fluoride, with the aid of a first reduction reaction. The first reduction reaction may be controlled, for example, by regulating the gas phase etching temperature during the gas phase etching.

Analogously, in particular the etching medium made of gaseous hydrogen fluoride is applied to second joining partner 21—for example, including a germanium material—of second wafer 2, a second reduction reaction being used to remove the germanium oxide material from a germanium oxide material of second oxide layer 21', in interaction with the etching medium, and a germanium surface covered with fluorine atoms (second protective layer 21") being formed.

Figure 4:
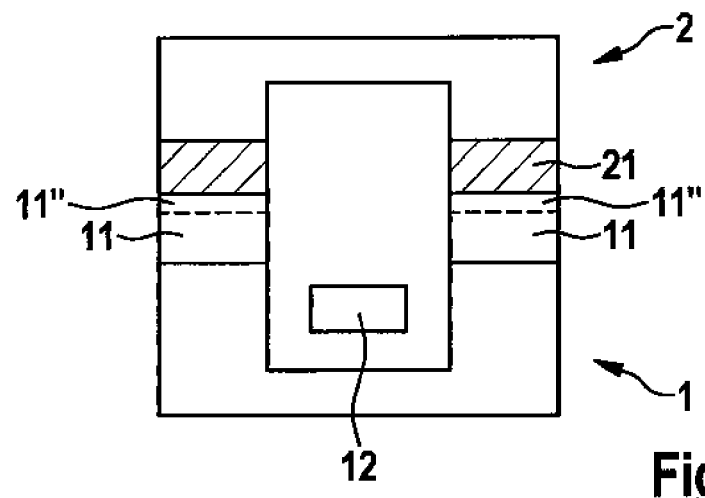

FIG. 4 illustrates the fourth manufacturing step, first and second wafers 1, 2 being joined in such a way that first joining partner 11 and second joining partner 21 are in contact at least in some areas.

Figure 5:
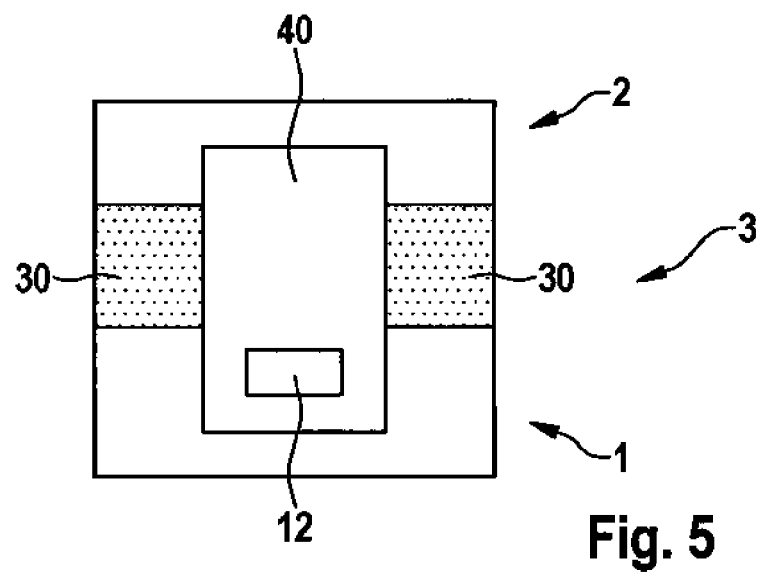

FIG. 5 shows a finished micromechanical component 3 according to the present invention, in a final manufacturing step, in particular the fifth manufacturing step, first and second joining partners 11, 21 being heated and integrally joined to form a connecting layer 30. In connecting layer 30, a eutectic joining material is formed from first joining partner 11 and second joining partner 21.

Optionally, the bonding process is carried out at different chamber pressures so that a certain internal pressure is generated in the interior of a cavity 40 which is hermetically tightly sealed by connecting layer 30.

Optionally, second joining partner 21 is applied to second wafer 2 by LPCVD deposition in the second manufacturing step, germanium as the reaction gas being conducted together with a carrier gas made of hydrogen into a process chamber. During the LPCVD deposition, hydrogen atoms are incorporated into the germanium layer of second joining partner 21. During the fifth method step, a diffusion of the hydrogen atoms intercalated in the germanium layer of second joining partner 21 is triggered by the heating to the joining temperature, so that the hydrogen atoms react with the fluorine atoms deposited on or intercalated into first 11' and second protective layer 21" of first 11 and second joining partner 21 to form HF molecules. The HF molecules thus formed advantageously cause the newly formed germanium oxide and/or aluminum oxide of first and/or second joining partners 11, 21 to also be removed after the gas phase etching in the third method step—here in the chronologically subsequent fifth method step.

Figure 6A:
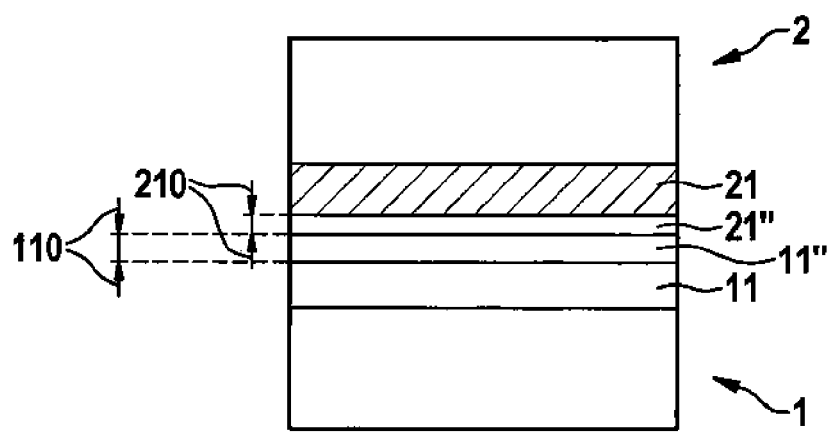
FIGS. 6*a* and 6*b* show method steps according to one exemplary specific embodiment of the method according to the present invention.
Figure 6B:
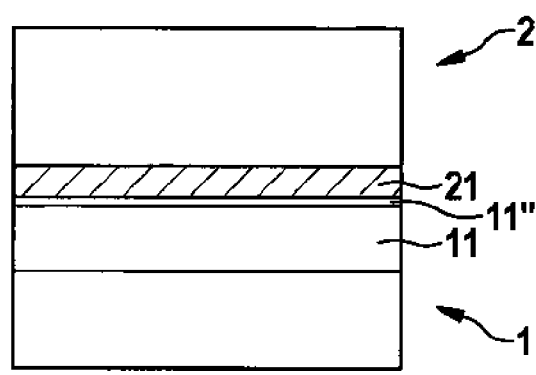

FIGS. 6*a* and 6*b* show method steps according to one exemplary specific embodiment of the method according to the present invention. FIG. 6*a* shows a detail of joined first and second wafers 1, 2 prior to the fifth method step, here an aluminum fluoride layer 11" and a germanium fluoride layer 21" being shown between an aluminum material 11 and a germanium material 21. FIG. 6*b* shows second joining partner 21 without germanium fluoride layer 21".

Figure 7:
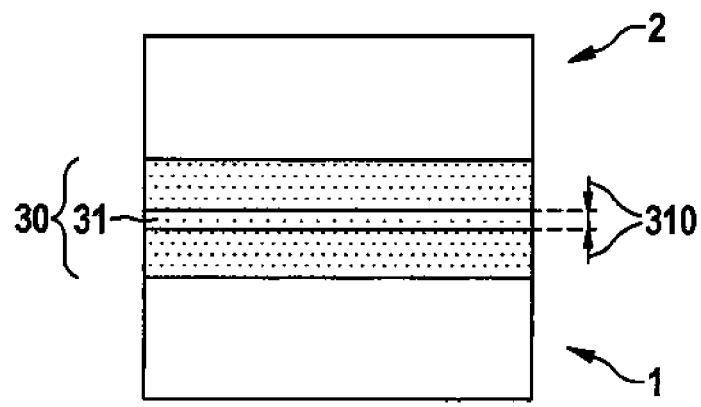
FIGS. 7 and 8 show different views of a connecting layer of a micromechanical component according to the present invention.
Figure 8:
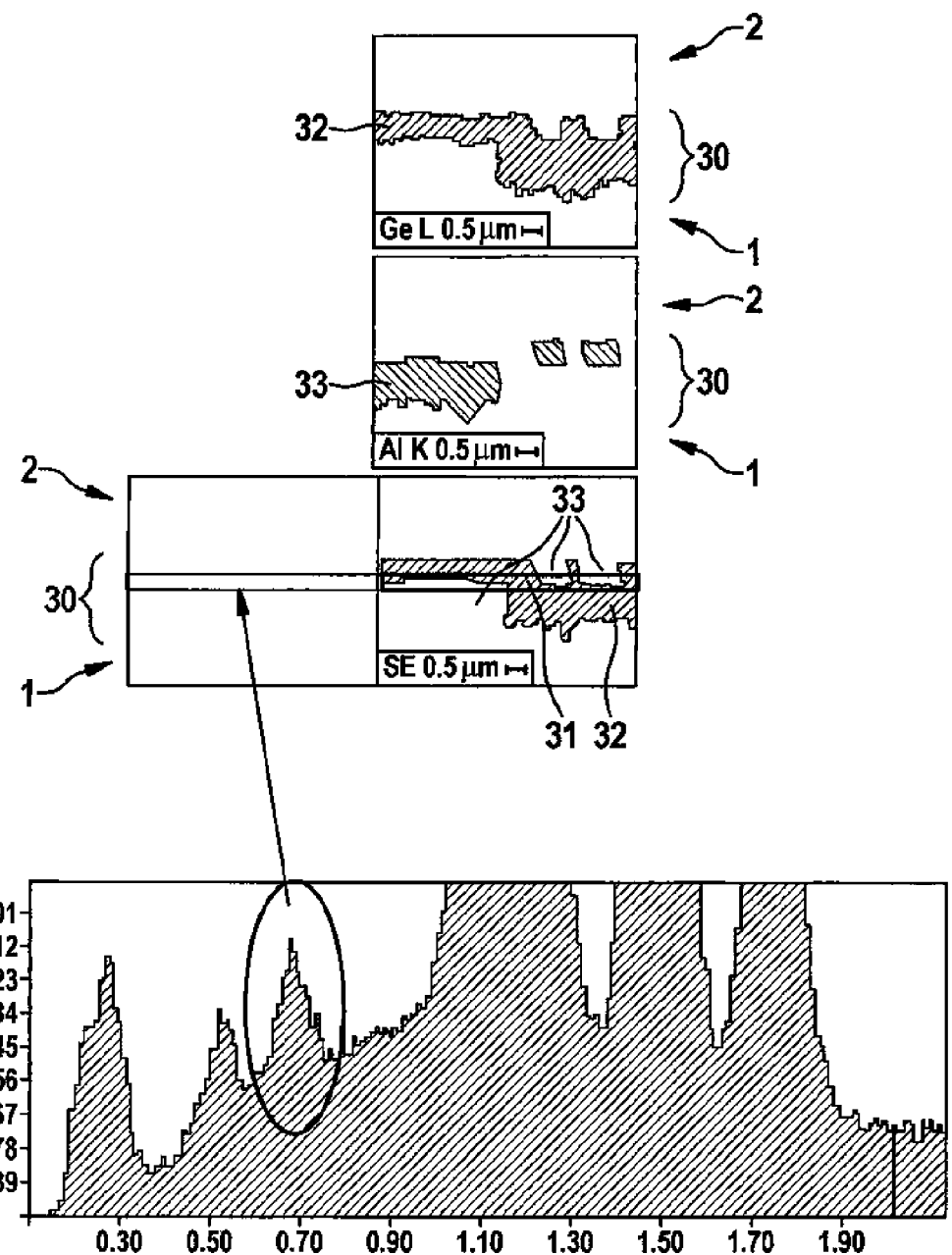

FIGS. 7 and 8 show different views of a connecting layer 30 of a micromechanical component 3 according to the present invention. Contrary to aluminum oxide, aluminum fluoride advantageously does not represent a diffusion barrier for aluminum and germanium during the bonding process, so that first and second joining partners 11, 21 may be integrally joined particularly efficiently to form eutectic joining material 30. In particular, first and second wafers 1, 2 are acted on by a pressing force during the joining in the fifth method step, so that a fixed contact is created between joining partners 11 and 21, and the aluminum material of first joining partner 11 and the germanium material of second joining partner 21 are able to penetrate first and/or second protective layer 11", 21", so that the aluminum material comes in contact with the germanium material and the eutectic joining material is formed. FIG. 7 shows fluorine-containing intermediate layer 31 having intermediate layer thickness 310 which is formed in this process. FIG. 8 (top) shows connecting layer 30 in different views after the fifth method step. Additionally, fluorine-containing intermediate layer 31 is shown.

Due to interdiffusion of the aluminum material of first joining partner 11 and of the germanium material of second joining partner 21 through intermediate layer 31 taking place at different rates locally during the joining process, areas having different mixing ratios in joining layer 30 are created.

In the fifth method step, e.g., a first subarea 33 of connecting layer 30 having a locally increased aluminum concentration may thus form on the side of second wafer 2 on which the germanium layer of second joining partner 21 was originally situated, and a second subarea 32 having a locally increased germanium concentration may form on the side of first wafer 1 on which the aluminum layer of first joining partner 11 was originally situated. Moreover, areas (not shown) exist in which a continuous diffusion gradient from aluminum into germanium, and vice versa, through intermediate layer 31 may be found in a planar manner, in particular in a locally not limited manner. This means, for example, that, proceeding from the side of first wafer 1 on which aluminum was originally deposited, a concentration gradient extends from aluminum into the germanium layer which is situated on second wafer 2, or, proceeding from the side of second wafer 2 on which germanium was originally deposited, a concentration gradient extends from germanium into the aluminum layer which is situated on the first wafer. The described areas may be situated directly next to each other and, due to their mixing/meshing, favor the mechanical stability of the connecting layer (bonding layer) 30.

In particular, the first, second, third, fourth and/or fifth manufacturing step(s) of the method according to the present invention may be carried out sequentially or in an arbitrary (i.e., technically meaningful) order, in particular intermediate steps also being possible. According to one exemplary specific embodiment of the method according to the present invention, the third manufacturing step occurs after the first manufacturing step, the fourth manufacturing step occurs after the second and third manufacturing step and/or the fifth manufacturing step occurs after the fourth manufacturing step.

What is claimed is:

1. A method for manufacturing a micromechanical component, comprising:
   in a first manufacturing step, applying a first material layer including a first joining partner to a first wafer;
   in a second manufacturing step, applying a second material layer including a second joining partner to a second wafer;
   in a third manufacturing step, producing a micromechanical structure in the first wafer by gas phase etching with the aid of a gaseous etching medium, wherein the gaseous etching medium is applied to the first joining partner during the gas phase etching;
   in a fourth manufacturing step, joining the first and second wafers in such a way that the first joining partner and the second joining partner are in contact at least in some areas; and
   in a fifth manufacturing step, heating the first and second joining partners to integrally join the first and second joining partners to form a connecting layer, an eutectic joining material being formed in the connecting layer from the first joining partner and the second joining partner;
   wherein in the third manufacturing step, the micromechanical structure is exposed by gas phase etching with the aid of the gaseous etching medium, a sacrificial layer in the first material layer being removed; and
   wherein in the third manufacturing step, a first oxide layer of the first joining partner is removed by a first reduction reaction with the aid of the gaseous etching medium, and a first protective layer is generated on a surface of the first joining partner, the first oxide layer including an aluminum oxide material and the first protective layer including an aluminum fluoride material.

2. The method as recited in claim 1, wherein one of:
   an aluminum material is used as the first joining partner and a germanium material is used as the second joining partner; or
   a germanium material is used as the first joining partner and an aluminum material is used as the second joining partner; or
   a metallic alloy is used as the first and second joining partners, the metallic alloy being an aluminum-germanium alloy.

3. The method as recited in claim 2, A method for manufacturing a micromechanical component, comprising:
   in a first manufacturing step, applying a first material layer including a first joining partner to a first wafer;
   in a second manufacturing step, applying a second material layer including a second joining partner to a second wafer;
   in a third manufacturing step, producing a micromechanical structure in the first wafer by gas phase etching with the aid of a gaseous etching medium, wherein the gaseous etching medium is applied to the first joining partner during the gas phase etching;
   in a fourth manufacturing step, joining the first and second wafers in such a way that the first joining partner and the second joining partner are in contact at least in some areas; and
   in a fifth manufacturing step, heating the first and second joining partners to integrally join the first and second joining partners to form a connecting layer, an eutectic joining material being formed in the connecting layer from the first joining partner and the second joining partner;
   wherein in the third manufacturing step, the micromechanical structure is exposed by gas phase etching with the aid of the gaseous etching medium, a sacrificial layer in the first material layer being removed; and
   wherein in the third manufacturing step, the gaseous etching medium is applied to the second joining partner, and a second oxide layer of the second joining partner is removed by a second reduction reaction with the aid of the gaseous etching medium, and a second protective layer is generated on the second joining partner, the second oxide layer including a germanium oxide material and the second protective layer including a germanium fluoride material.

4. The method as recited in claim 3, wherein the second protective layer is generated in such a way that the second protective layer has a fluorine-covered germanium surface.

5. A method for manufacturing a micromechanical component, comprising:
- in a first manufacturing step, applying a first material layer including a first joining partner to a first wafer;
- in a second manufacturing step, applying a second material layer including a second joining partner to a second wafer;
- in a third manufacturing step, producing a micromechanical structure in the first wafer by gas phase etching with the aid of a gaseous etching medium, wherein the gaseous etching medium is applied to the first joining partner during the gas phase etching;
- in a fourth manufacturing step, joining the first and second wafers in such a way that the first joining partner and the second joining partner are in contact at least in some areas; and
- in a fifth manufacturing step, heating the first and second joining partners to integrally join the first and second joining partners to form a connecting layer, an eutectic joining material being formed in the connecting layer from the first joining partner and the second joining partner;
- wherein in the third manufacturing step, the micromechanical structure is exposed by gas phase etching with the aid of the gaseous etching medium, a sacrificial layer in the first material layer being removed; and
- wherein in the third manufacturing step, at least one of a first layer thickness of the first protective layer and a second layer thickness of the second protective layer is defined by controlling a gas phase etching temperature of the etching medium.

6. A method for manufacturing a micromechanical component, comprising:
- in a first manufacturing step, applying a first material layer including a first joining partner to a first wafer;
- in a second manufacturing step, applying a second material layer including a second joining partner to a second wafer;
- in a third manufacturing step, producing a micromechanical structure in the first wafer by gas phase etching with the aid of a gaseous etching medium, wherein the gaseous etching medium is applied to the first joining partner during the gas phase etching;
- in a fourth manufacturing step, joining the first and second wafers in such a way that the first joining partner and the second joining partner are in contact at least in some areas; and
- in a fifth manufacturing step, heating the first and second joining partners to integrally join the first and second joining partners to form a connecting layer, an eutectic joining material being formed in the connecting layer from the first joining partner and the second joining partner;
- wherein in the third manufacturing step, the micromechanical structure is exposed by gas phase etching with the aid of the gaseous etching medium, a sacrificial layer in the first material layer being removed; and
- wherein in the fifth manufacturing step, an intermediate layer is generated within the connecting layer from at least one of the first and second protective layers.

7. The method as recited in claim 1, wherein in the fifth manufacturing step, the first and second joining partners are heated to a joining temperature, a pressing force being acted on the first and second wafers, and wherein at least one of (i) the joining temperature is changed according to a defined temperature profile and (ii) the pressing force being changed according to a defined pressing force profile during the integral joining of the first and second joining partners to form the connecting layer.

8. The method as recited in claim 1, wherein at least one of (i) in the first manufacturing step, the first joining partner is deposited on the first wafer by cathodic evaporation, and (ii) in the second manufacturing step, the second joining partner is applied to the second wafer by low-pressure chemical vapor deposition.

9. The method as recited in claim 1, wherein at least one of the first joining partner and the second joining partner is applied with the aid of at least one of chemical vapor deposition, physical vapor deposition, chemical vapor deposition at atmospheric pressure, and plasma-assisted chemical vapor deposition.

* * * * *